US009468123B2

(12) United States Patent
Yu

(10) Patent No.: US 9,468,123 B2
(45) Date of Patent: Oct. 11, 2016

(54) ELECTRONIC DEVICE WITH QUICK RELEASING FUNCTION FOR AN INTERFACE CARD

(71) Applicant: Wistron Corporation, New Taipei (TW)

(72) Inventor: Yi-Feng Yu, New Taipei (TW)

(73) Assignee: Wistron Corporation, New Taipei (TW)

( * ) Notice: Subject to any disclaimer, the term of this patent is extended or adjusted under 35 U.S.C. 154(b) by 8 days.

(21) Appl. No.: 14/615,443

(22) Filed: Feb. 6, 2015

(65) Prior Publication Data

US 2016/0095245 A1  Mar. 31, 2016

(30) Foreign Application Priority Data

Sep. 25, 2014  (TW) .............................. 103217076 U

(51) Int. Cl.
*H05K 7/02* (2006.01)
*H05K 7/04* (2006.01)
*H05K 7/14* (2006.01)

(52) U.S. Cl.
CPC ............ *H05K 7/1435* (2013.01); *H05K 7/142* (2013.01)

(58) Field of Classification Search
USPC ........ 361/807, 728–730, 759, 801, 809, 810
See application file for complete search history.

(56) References Cited

U.S. PATENT DOCUMENTS

| | | | | |
|---|---|---|---|---|
| 5,038,308 A * | 8/1991 | Le | ............................. | G06F 1/18 361/796 |
| 5,661,640 A * | 8/1997 | Mills | .................... | H05K 9/0049 174/384 |
| 5,745,345 A * | 4/1998 | Deguchi | .............. | G06K 7/0047 361/737 |
| 6,122,176 A * | 9/2000 | Clements | ................ | G06F 1/184 361/752 |
| 6,693,799 B2 * | 2/2004 | Gough | .................... | G06F 1/184 174/138 G |
| 6,752,276 B2 * | 6/2004 | Rumney | ................ | H05K 7/142 211/41.17 |
| 6,754,085 B2 * | 6/2004 | Kalkbrenner | .......... | H05K 7/142 361/752 |
| 7,294,009 B1 * | 11/2007 | Peng | .................... | H05K 7/1431 439/326 |
| 7,372,707 B2 * | 5/2008 | Lin | ........................ | G06F 1/184 361/807 |

FOREIGN PATENT DOCUMENTS

TW            M334605            6/2008

* cited by examiner

*Primary Examiner* — Hung S Bui
(74) *Attorney, Agent, or Firm* — Winston Hsu; Scott Margo

(57) ABSTRACT

An electronic device with quick releasing function for an interface card includes a base, a connector and a quick releasing mechanism. The base is adapted to hold the interface card. The connector is disposed on the base to electrically connect with the interface card. The quick releasing mechanism is disposed on the base and includes a first constraining component and a second constraining component. The first constraining component is movably disposed on the base and can be shifted between a releasing position and a constraining position. The first constraining component moves to the constraining position to contact against a side of the interface card opposite to the connector. The second constraining component is disposed on the base and located on another side of the first constraining component to contact against the interface card corresponding to the connector.

12 Claims, 12 Drawing Sheets

ELECTRONIC DEVICE WITH QUICK RELEASING FUNCTION FOR AN INTERFACE CARD

BACKGROUND OF THE INVENTION

1. Field of the Disclosure

The present disclosure relates to an electronic device with a detachable interface card, and more particularly, to an electronic device with quick releasing function for the interface card.

2. Description of the Prior Art

Please refer to FIG. 12. FIG. 12 is a diagram of a circuit board 60 and a housing 62 in prior art. The circuit board 60 is an expansion card which can be installed inside the computer apparatus to increase operational efficiency. The computer apparatus may have a plurality of circuit boards 60 according to actual demand. A conventional assembling method utilizes a fixing component 64 (such as the screw or the bolt) to fix the circuit board 60 on a boss 66 of the housing 62, and a cover (not shown in figure) can press over the circuit board 60 to ensure the circuit board 60 is stably disposed inside the housing 62. However, the conventional assembling method is inconveniently executed because an extra tool is essential for assembly/disassembly of the circuit board 60. The extra tool can be a screwdriver applied to the fixing component 64. Thread structures of the fixing component 64 may be damaged after repeated operation, so the conventional assembling method has a drawback of inferior assembly strength.

SUMMARY OF THE DISCLOSURE

The present disclosure provides an electronic device with quick releasing function for the interface card for solving above drawbacks.

According to the claimed disclosure, an electronic device with quick releasing function for an interface card includes a base, a connector and a quick releasing mechanism. The interface card is disposed on the base. The connector is disposed on the base to electrically connect with the interface card. The quick releasing mechanism is disposed on the base. The quick releasing mechanism includes a first constraining component and a second constraining component. The first constraining component is movably disposed on the base and adapted to shift between a releasing position and a constraining position. The first constraining component contacts against a side of the interface card opposite to the connector while moving to the constraining position. The second constraining component is disposed on the base and located on another orientation relative to the first constraining component. The second constraining component is adapted to contact the interface card against the connector.

According to the claimed disclosure, the first constraining component includes a sliding portion, a supporting portion and a buckling portion. The sliding portion is slidably disposed on the base, the supporting portion is disposed on the sliding portion to support a first surface of the interface card, and the buckling portion is connected to the supporting portion to press a second surface of the interface card opposite to the first surface.

According to the claimed disclosure, the buckling portion includes a protrusion piercing through an opening formed on the interface card, so as to constrain a movement of the interface card by the supporting portion of the first constraining component.

According to the claimed disclosure, the quick releasing mechanism further includes a positioning component locked on a locking hole formed on the base. The sliding portion includes a slot structure slidably disposed on the positioning component. The sliding portion is adapted to move between the releasing position and the constraining position by assembly of the slot structure and the positioning component.

According to the claimed disclosure, the sliding portion further includes at least one contacting unit disposed on an inner wall of the slot structure. The contacting unit contacts against the positioning component to constrain a relative movement between the slot structure and the positioning component.

According to the claimed disclosure, the base further includes at least one slide chute. The first constraining component further includes at least one guiding portion disposed on a bottom of the sliding portion opposite to the supporting portion and slidably disposed inside the at least one slide chute.

According to the claimed disclosure, the second constraining component includes a main body and an engaging portion connected to each other. The main body is slidably disposed on the base to shift between a disassembling position and an assembling position. The engaging portion is engaged with the interface card while the main body moves to the assembling position.

According to the claimed disclosure, the second constraining component includes a main body and an engaging portion connected to each other. The main body is slidably disposed on the base, and the other side of the interface card slidably contacts against the engaging portion.

According to the claimed disclosure, the quick releasing mechanism further includes a third constraining component rotatably disposed on the base. The third constraining component contacts against the side of the interface card while the interface card is electrically connected to the connector.

According to the claimed disclosure, the third constraining component includes a rotating portion and a restraining portion connected to each other. The rotating portion pivots to the base via a shaft to shift between a blocking position and an unblocking position. The restraining portion contacts against the interface card while the rotating portion is shifted to the blocking position.

According to the claimed disclosure, the restraining portion includes a baffle to support the interface card while the rotating portion is shifted to the unblocking position.

According to the claimed disclosure, the base includes at least one protruding platform whereon the first constraining component and/or the second constraining component is disposed.

According to the claimed disclosure, the base includes two guiding bar structures arranged in parallel. The first constraining component is slidably disposed between the two guiding bar structures.

The quick releasing mechanism in the first embodiment of the present disclosure utilizes the movable first constraining component to contact against the side of the interface card opposite to the connector, and further utilizes the movable second constraining component to contact against another side of the interface card different from the connector and the first constraining component, so that three sides of the interface card are respectively constrained by the connector, the first constraining component and the second constraining component to stably assemble the interface card with the base. The quick releasing mechanism in the second embodiment of the present disclosure utilizes the movable first constraining component to contact against the side of the interface card opposite to the connector, utilizes the immovable second constraining component to contact against another side of the interface card different from the connector and the first constraining component, and further utilizes the rotatable third constraining component to contact against the side of the interface card identical with the first constraining component, so the three sides of the interface card are respectively constrained by the connector, the first constraining component, the second constraining component and the third constraining component to stably assemble the interface card with the base. Comparing to the prior art, the electronic device with quick releasing function for the interface card of the present disclosure has advantages of simple structure and easy assembly/disassembly without the extra tools.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
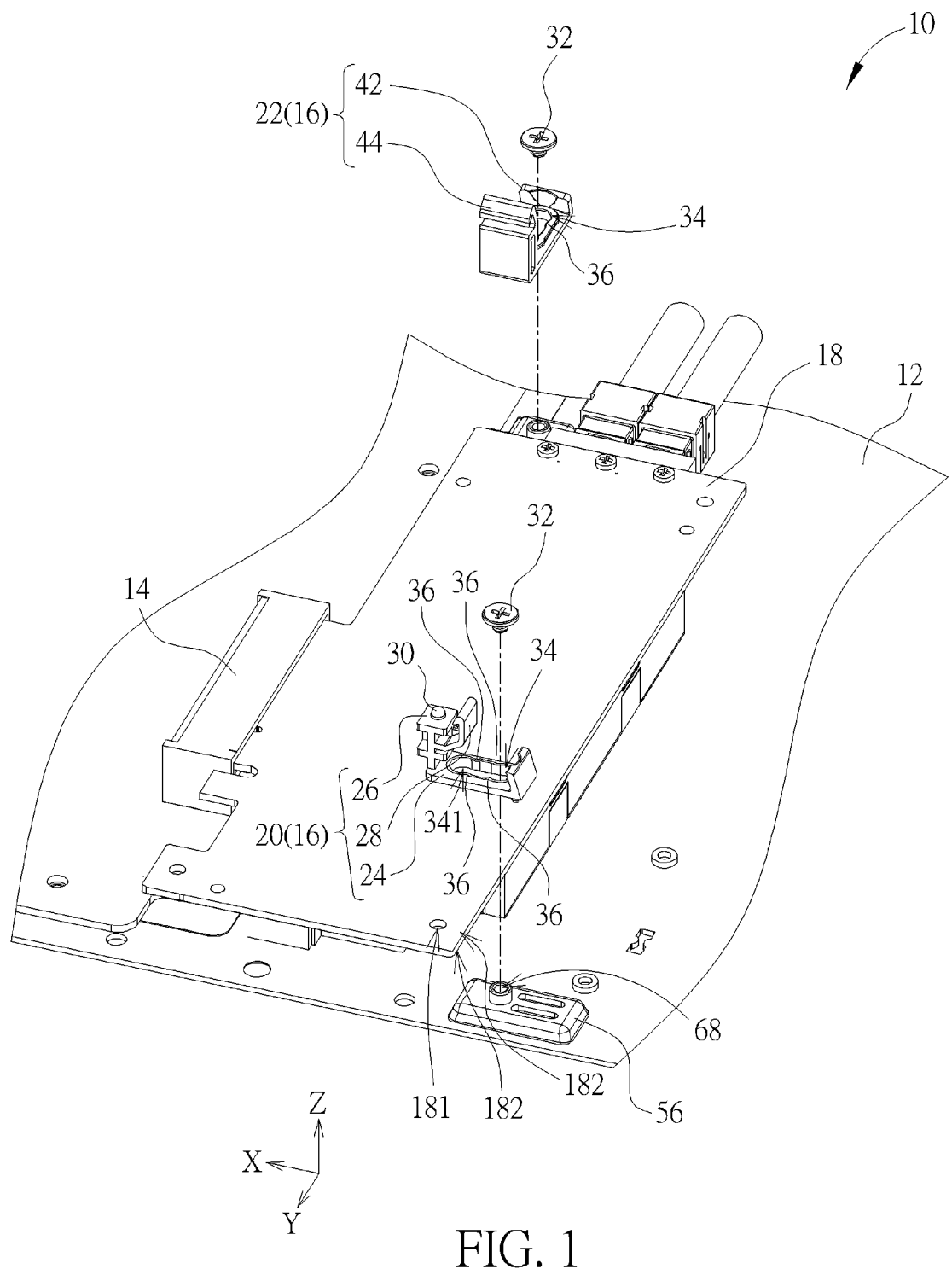
FIG. 1 is an exploded diagram of an electronic device according to a first embodiment of the present disclosure.

Please refer to FIG. 1. FIG. 1 is an exploded diagram of an electronic device 10 according to a first embodiment of the present disclosure. The electronic device 10 includes a base 12, a connector 14 and a quick releasing mechanism 16. The connector 14 is disposed on the base 12. The base 12 can be utilized to hold an interface card 18, and the interface card 18 levelly inserts into the connector 14. The quick releasing mechanism 16 is disposed on the base 12 to fix position of the interface card 18, so that the interface card 18 can be stably assembled with the connector 14 and not be separated accidentally. Therefore, the electronic device 10 of the present disclosure has quick releasing function for the interface card 18. The user can manually assemble and/or disassemble the interface card 18 without auxiliary of extra tools.

The quick releasing mechanism 16 of the first embodiment includes a part of the base 12, a first constraining component 20 and a second constraining component 22. The first constraining component 20 is movably disposed on the base 12, and can be shifted between a releasing position and a constraining position. The second constraining component 22 is disposed on another side of the first constraining component 20, and movably disposed on the base 12 to shift between a disassembling position and an assembling position. The first constraining component 20 includes a sliding portion 24, a supporting portion 26 and a buckling portion 28. The sliding portion 24 is slidably disposed on the base 12, the supporting portion 26 is disposed on the sliding portion 24, and the buckling portion 28 is connected to the supporting portion 26. While the interface card 18 is put on the first constraining component 20, the supporting portion 26 supports a first surface 181 (the bottom) of the interface card 18, and the buckling portion 28 presses over a second surface 182 (the top opposite to the foresaid bottom) of the interface card 18, so as to constrain a movement of the interface card 18 at Z-axis. In addition, the buckling portion 28 may optionally include a protrusion 30 which pierces through an opening 183 formed on the interface card 18 to constrain a movement of the interface card 18 at X-axis and Y-axis, so that the interface card 18 cannot move by constraint of the supporting portion 26 of the first constraining component 20.

Figure 2:
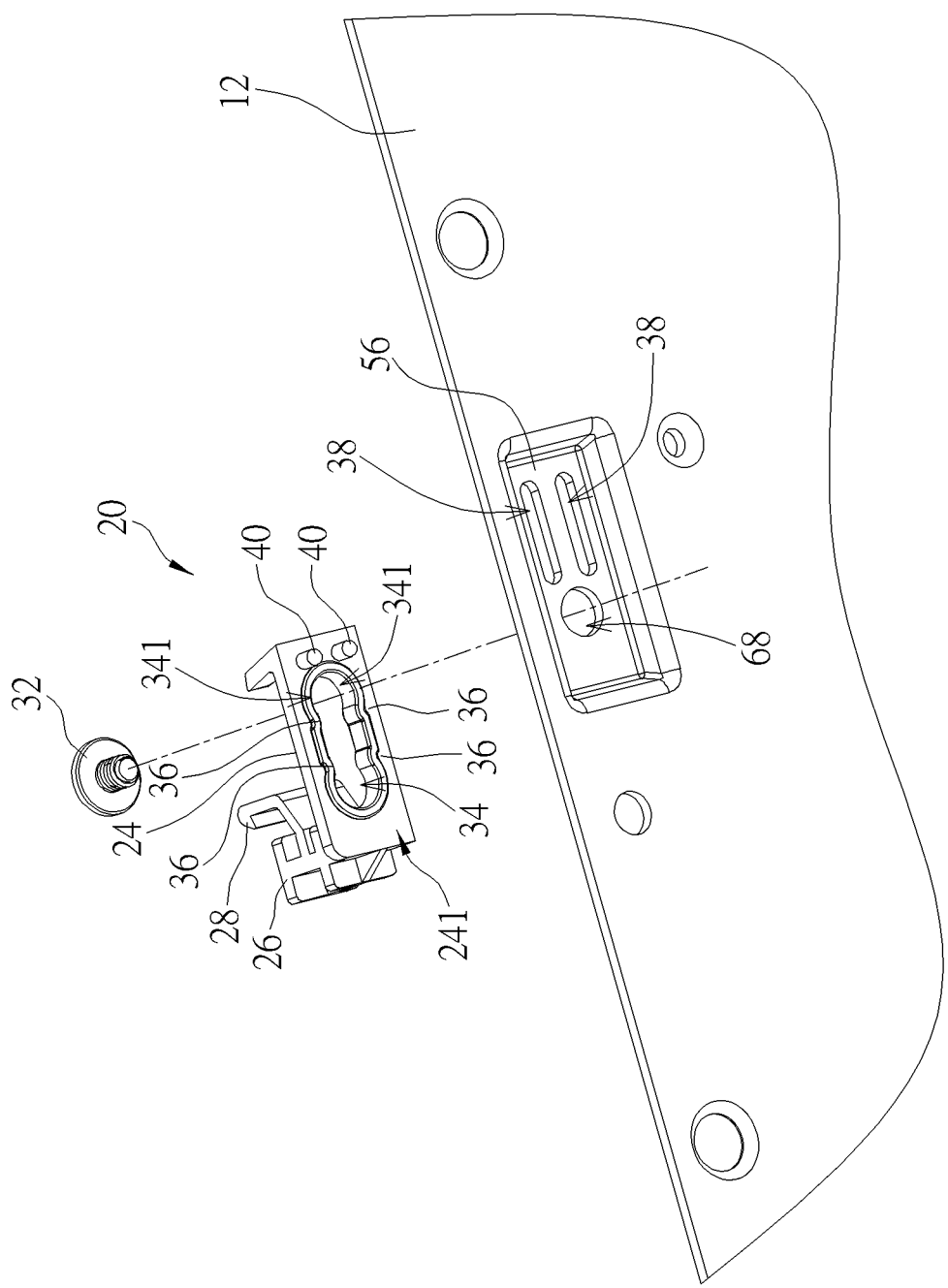
FIG. 2 is an exploded diagram of a quick releasing mechanism in another view according to the first embodiment of the present disclosure.

The quick releasing mechanism 16 further includes a positioning component 32 which is locked on a locking hole 68 formed on the base 12. The sliding portion 24 includes a slot structure 34, the sliding portion 24 is slidably disposed on the positioning component 32 via the slot structure 34, and the sliding portion 24 can move between the releasing position and the constraining position by assembly of the slot structure 34 and the positioning component 32. The sliding portion 24 further includes at least one contacting unit 36 disposed on an inner wall 341 of the slot structure 34, as shown in FIG. 2. While the sliding portion 24 moves relative to the positioning component 32, the contacting unit 36 can contact against the positioning component 32 to constrain a relative movement between the slot structure 34 and the positioning component 32, and the first constraining component 20 can be adjusted to stay at the releasing position or the constraining position according to user's demand.

Please refer to FIG. 2. FIG. 2 is an exploded diagram of the quick releasing mechanism 16 in another view according to the first embodiment of the present disclosure. The base 12 can optionally include one or more slide chutes 38, and the first constraining component 20 further includes several guiding portions 40 disposed on a bottom 241 (which is opposite to the supporting portion 26) of the sliding portion 24. An amount of the guiding portions 40 corresponds to an amount of the slide chutes 38. Generally, the present disclosure forms two slide chutes 38 arranged on the base 12 in parallel, and two guiding portions 40 of the first constraining component 20 respectively insert into the corresponding slide chute 38 in a slidable manner. Slide assembly of the slide chute 38 and the guiding portion 40 can prevent the first constraining component 20 from aslant rotation while moving relative to the base 12, so as to provide preferred assembly precision.

The second constraining component 22 includes a main body 42 and an engaging portion 44 connected to each other. The main body 42 can optionally include the slot structure 34 and/or the contacting unit 36, which have structures the same as the slot structure 34 and the contacting unit 36 of the sliding portion 24. The base 12 includes the positioning component 32 accordingly, so the main body 42 can be slidably disposed on the base 12 and shifted between the disassembling position and the assembling position. While the main body 42 moves to the assembling position, a lateral side of the interface card 18 is buckled by the engaging portion 44 to constrain the movement of the interface card 18 at Y-axis and X-axis.

Figure 3:
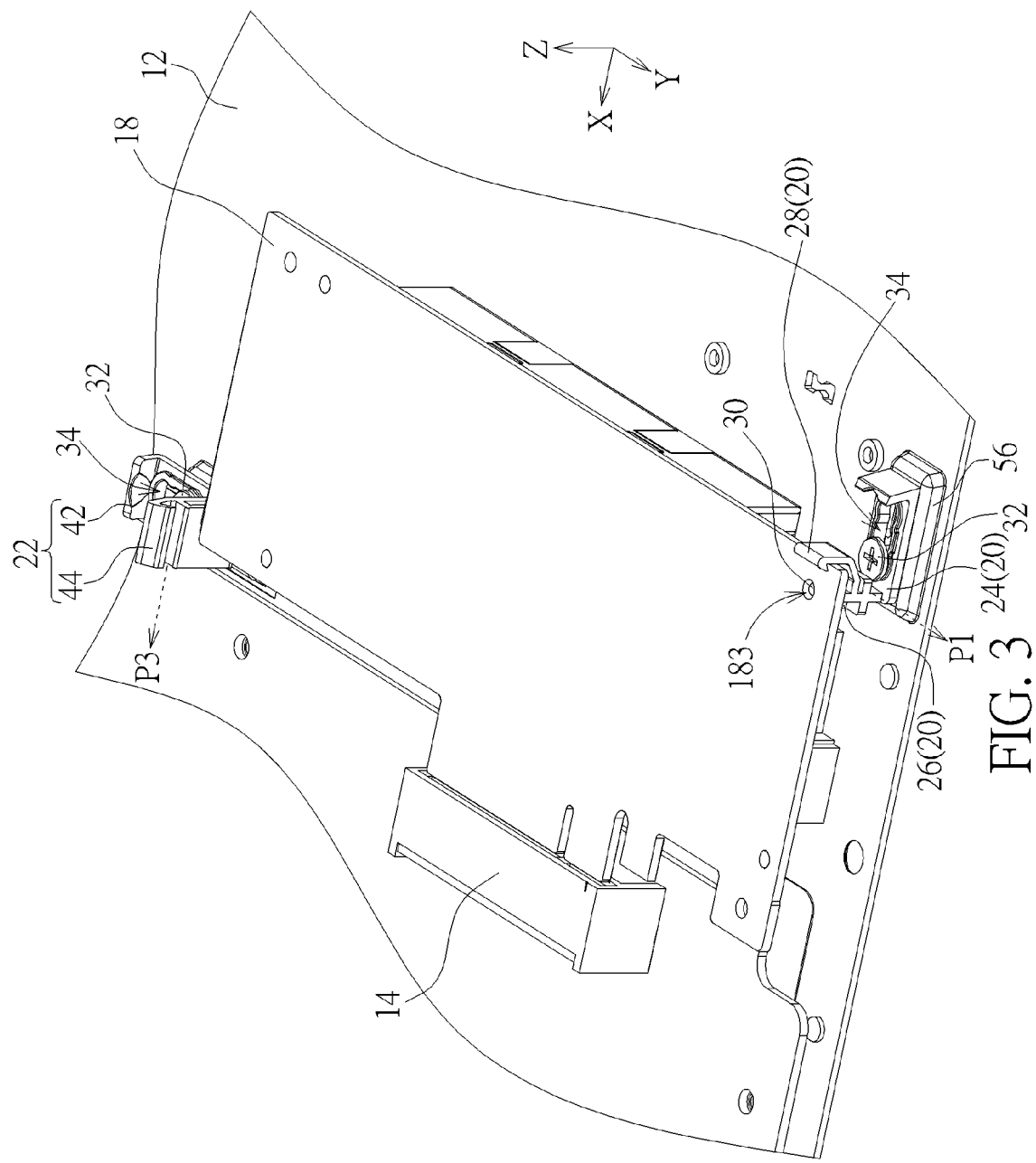
FIG. 3 to FIG. 5 respectively are diagrams of the electronic device indifferent operation modes according to the first embodiment of the present disclosure.
Figure 4:
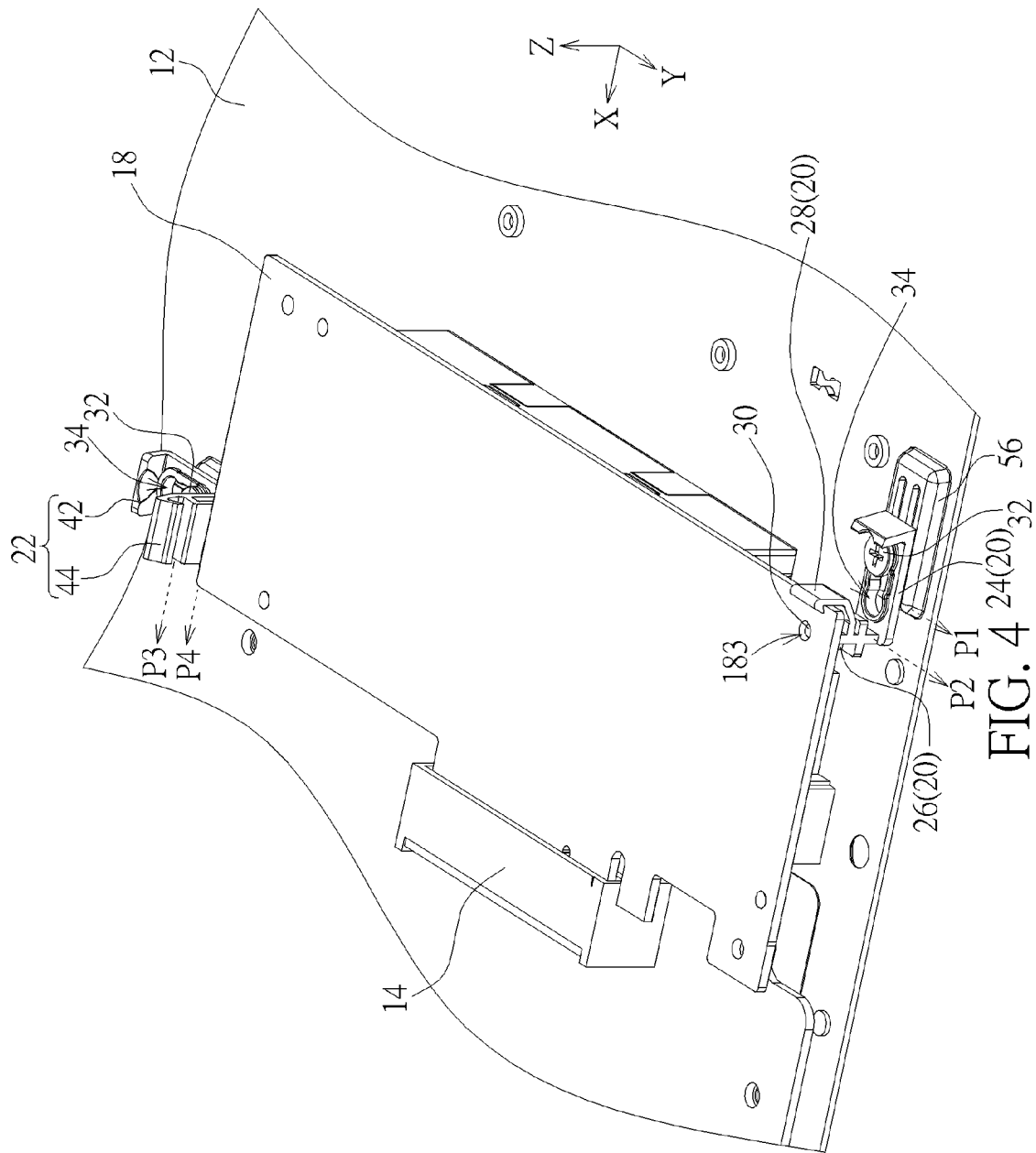
Figure 5:
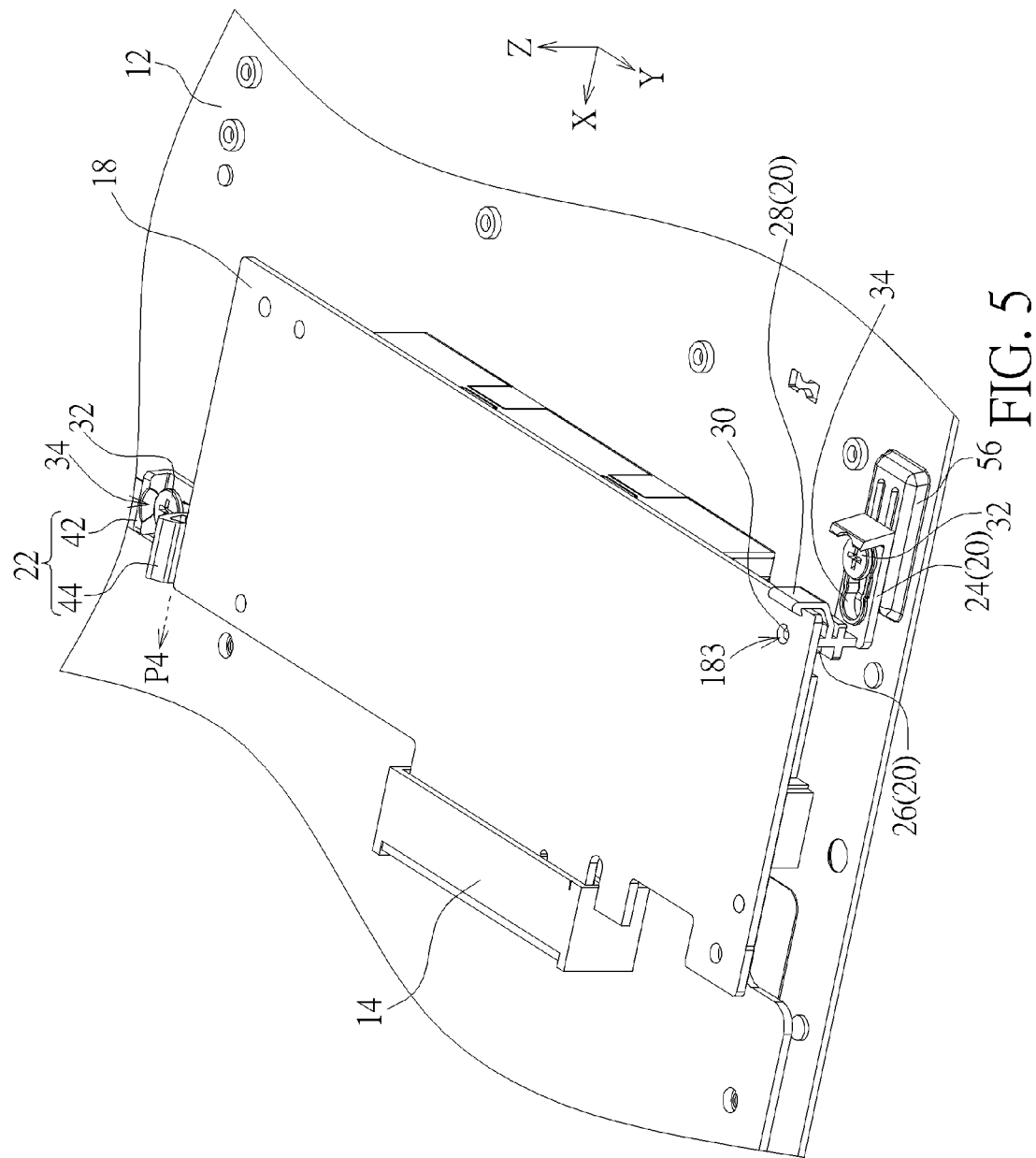

Please refer to FIG. 3 to FIG. 5. FIG. 3 to FIG. 5 respectively are diagrams of the electronic device 10 in different operation modes according to the first embodiment of the present disclosure. As shown in FIG. 3, the interface card 18 is assembled with the protrusion 30 of the first constraining component 20 via the opening 183 while the first constraining component 20 is located on the releasing position P1 and the second constraining component 22 is located on the disassembling position P3. As shown in FIG. 4, the first constraining component 20 is moved at X-axis, the first constraining component 20 is shifted from the releasing position P1 to the constraining position P2 to insert the interface card 18 into the connector 14; in the meantime, the second constraining component 22 is still located on the disassembling position P3. As shown in FIG. 5, the second constraining component 22 is driven to move at Y-axis, the second constraining component 22 is shifted from the disassembling position P3 to the assembling position P4, and the engaging portion 44 buckles the interface card 18 to stably assemble the interface card 18 with the connector 14. The above-mentioned procedures can be reversely executed for disassembly of the interface card 18. For example, the second constraining component 22 is moved from the assembling position P4 shown in FIG. 5 to the disassembling position P3 shown in FIG. 4, the first constraining component 20 is moved from the constraining position P2 shown in FIG. 4 to the releasing position P1 shown in FIG. 3, then the interface card 18 is not constrained by the connector 14 and the quick releasing mechanism 16 and can be easily disassembled from the base 12.

Figure 6:
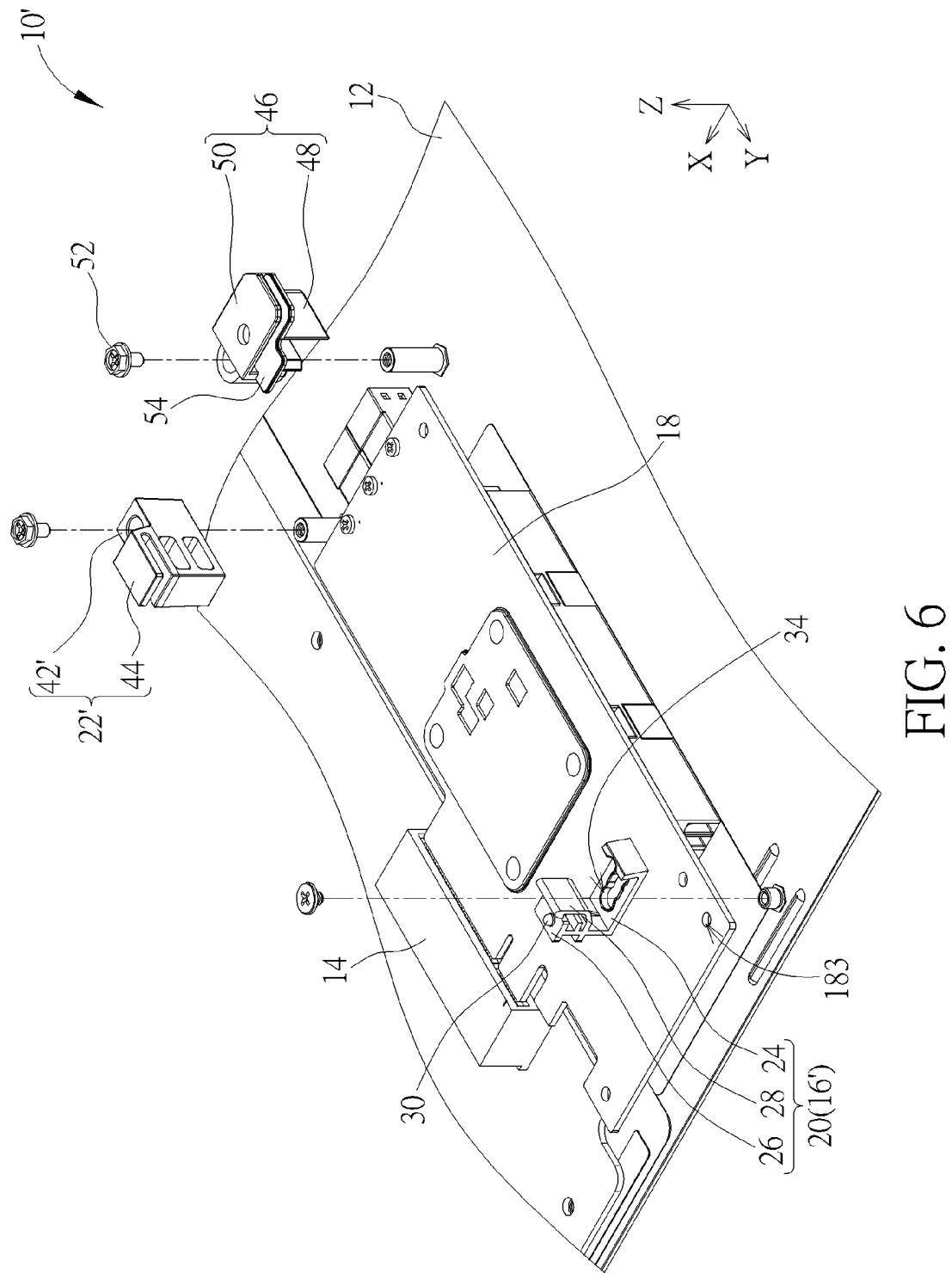
FIG. 6 is an exploded diagram of the electronic device according to a second embodiment of the present disclosure.

Please refer to FIG. 6. FIG. 6 is an exploded diagram of the electronic device 10' according to a second embodiment of the present disclosure. In the second embodiment, elements having the same numeral as ones of the first embodiment have the same structures and functions, and a detailed description is omitted herein for simplicity. The quick releasing mechanism 16' of the electronic device 10' can include a part of the base 12, the first constraining component 20, the second constraining component 22' and a third constraining component 46. The second constraining component 22' includes the main body 42' and an engaging portion 44 connected to each other. The main body 42' of the second embodiment is fixed on the base 12, and a side of the interface card 18 slidably contacts against the engaging portion 44. The third constraining component 46 can be rotatably disposed on the base 12. The third constraining component 46 includes a rotating portion 48 and a restraining portion 50 connected to each other. The rotating portion 48 pivots to the base 12 via a shaft 52, and the third constraining component 46 can be rotatably shifted between a blocking position and an unblocking position. The restraining portion 50 further can include a protruding baffle 54. The baffle 54 is utilized to support the interface card 18 while the rotating portion 48 is located on the unblocking position, and a movement of the interface card 18 is not restrained by the restraining portion 50. While the rotating portion 48 is located on the blocking position, the restraining portion 50 contacts against the interface card 18, which means the movement of the interface card 18 at X-axis and X-axis is constrained by the third constraining component 46.

Figure 7:
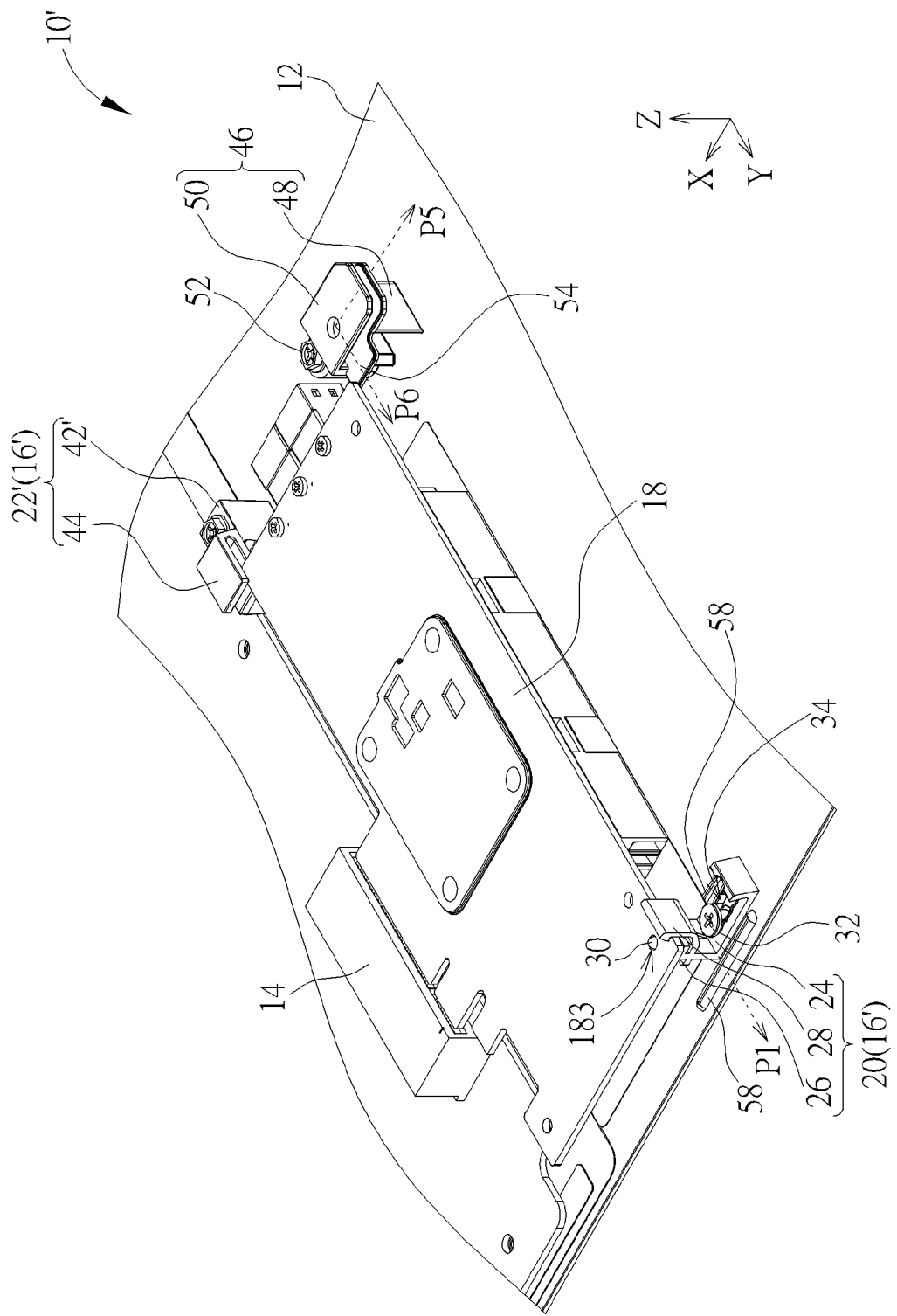
FIG. 7 to FIG. 9 respectively are diagrams of the electronic device in different operation modes according to the second embodiment of the present disclosure.
Figure 8:
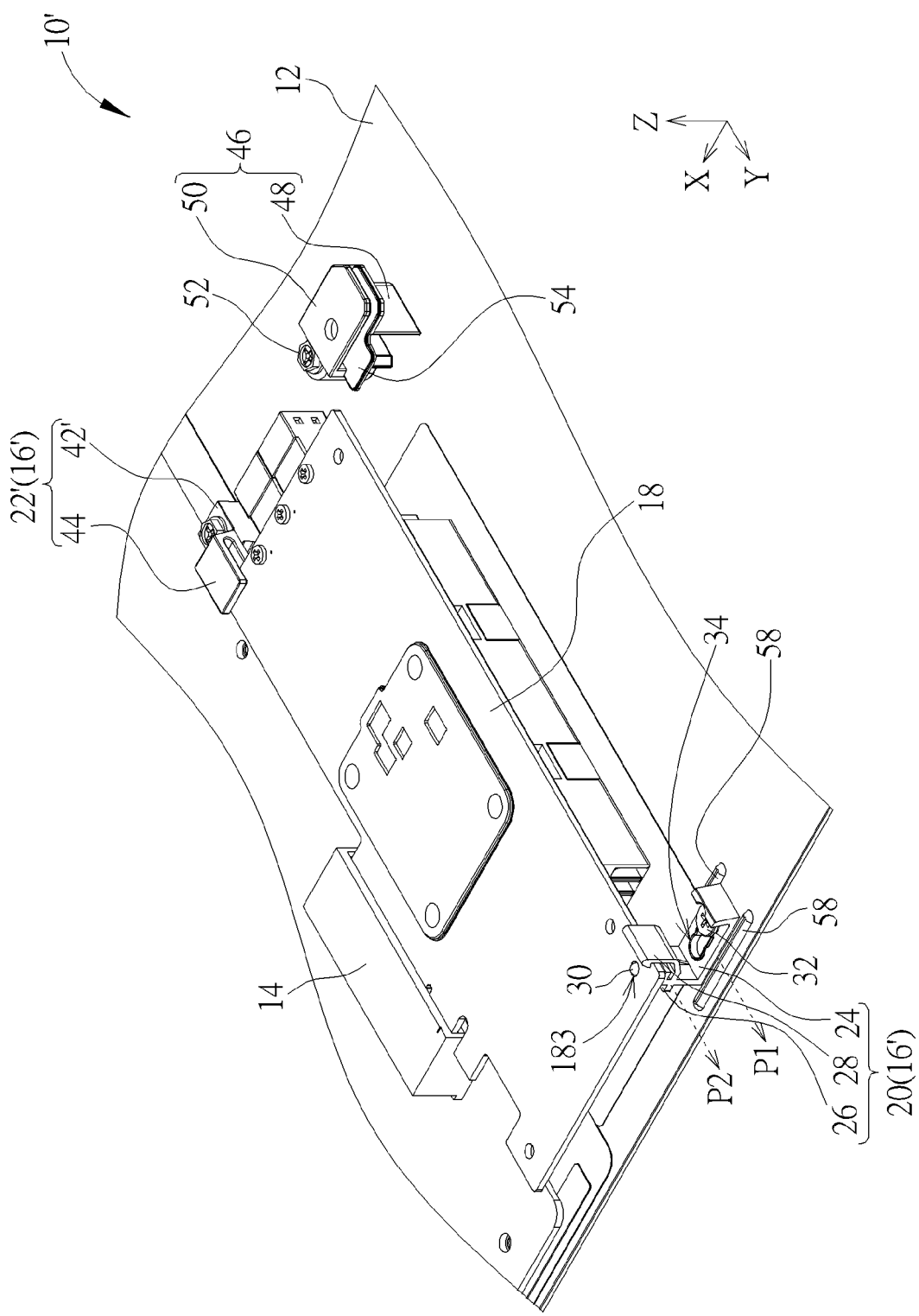
Figure 9:
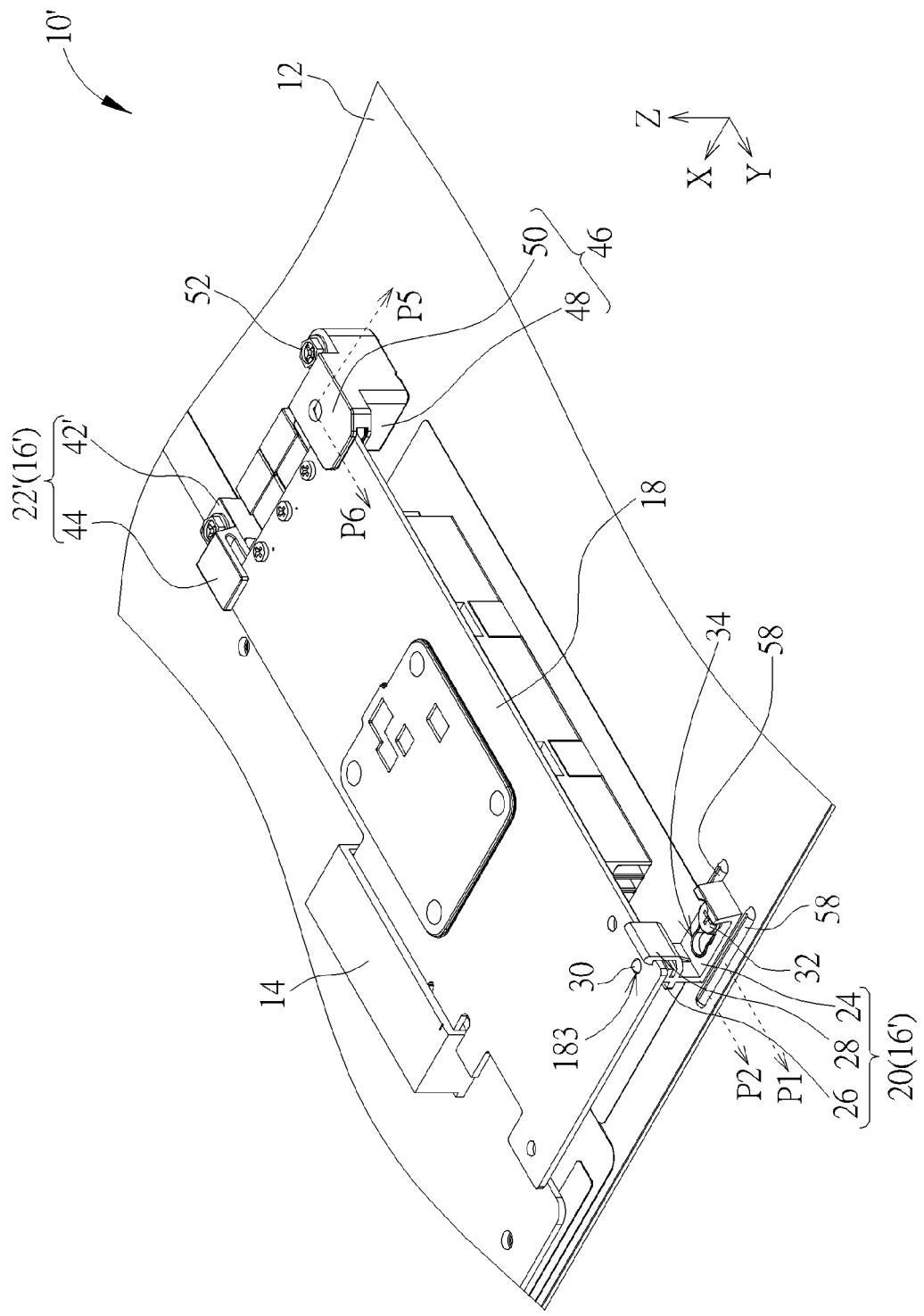

Please refer to FIG. 7 to FIG. 9. FIG. 7 to FIG. 9 respectively are diagrams of the electronic device 10' in different operation modes according to the second embodiment of the present disclosure. As shown in FIG. 7, the interface card 18 is assembled with the protrusion 30 of the first constraining component 20 via the opening 183, and the interface card 18 is fixed by the supporting portion 26 and the buckling portion 28; meanwhile, the first constraining component 20 is located on the releasing position P1 and the third constraining component 46 is located on the unblocking position P5, the interface card 18 partly contacts against the second constraining component 22'. As shown in FIG. 8, the first constraining component 20 is moved at X-axis, the first constraining component 20 is shifted from the releasing position P1 to the constraining position P2 to insert the interface card 18 into the connector 14, the interface card 18 moves into the engaging portion 44 of the second constraining component 22' deeper, and the third constraining component 46 is located on the unblocking position P5. As shown in FIG. 9, the third constraining component 46 is rotatably shifted from the unblocking position P5 to the blocking position P6, the restraining portion 50 and the first constraining component 20 both contact against the same side of the interface card 18, and the interface card 18 can be stably assembled with the connector 14. As mentioned in the first embodiment, the foresaid assembly procedures can be reversely executed to disassemble the interface card 18. For example, the third constraining component 46 is shifted from the blocking position P6 shown in FIG. 9 to the unblocking position P5 shown in FIG. 8, the first constraining component 20 is shifted from the constraining position P2 shown in FIG. 8 to the releasing position P1 shown in FIG. 7, and then the interface card 18 can be separated from the connector 14 to conveniently disassemble the interface card 18 from the quick releasing mechanism 16 and the base 12.

Figure 10:
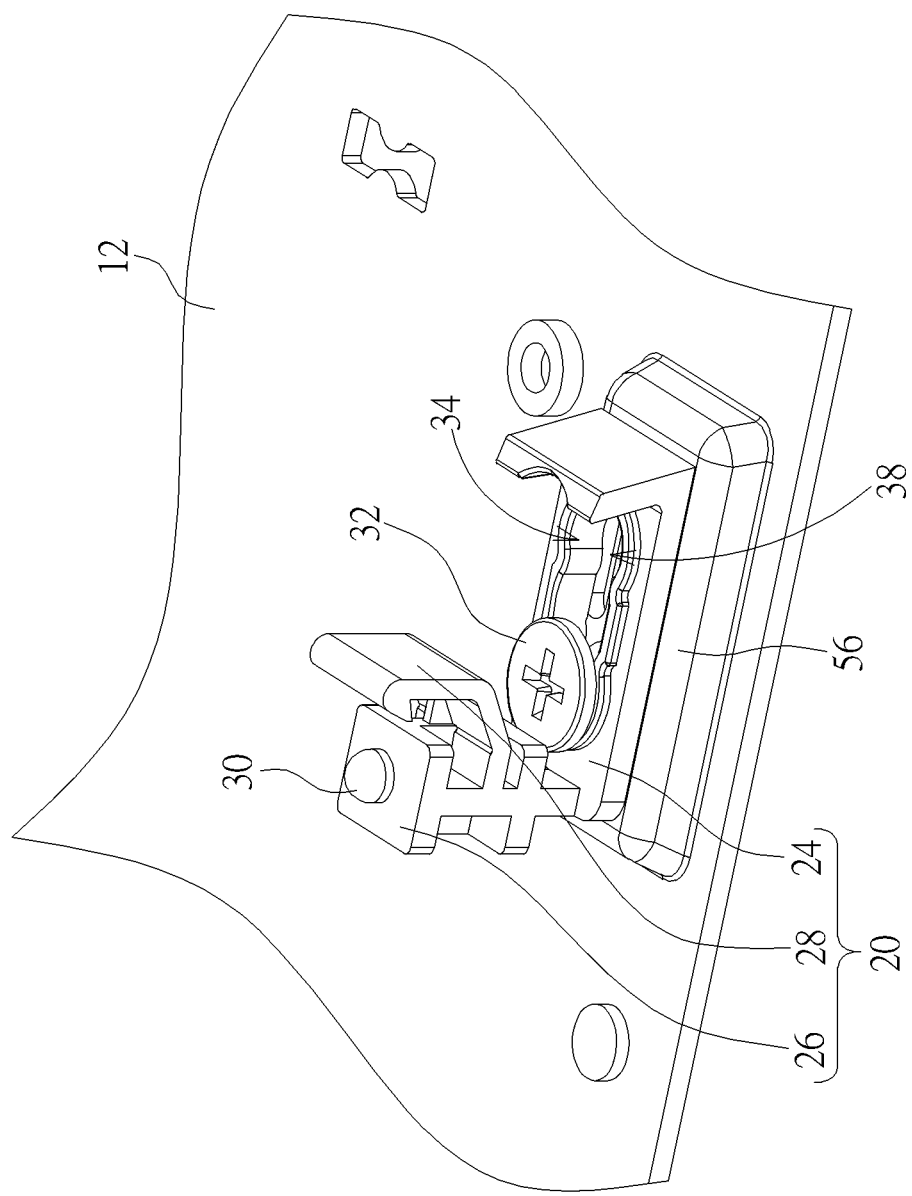
FIG. 10 and FIG. 11 respectively are diagrams of a base according to different embodiments of the present disclosure.
Figure 11:
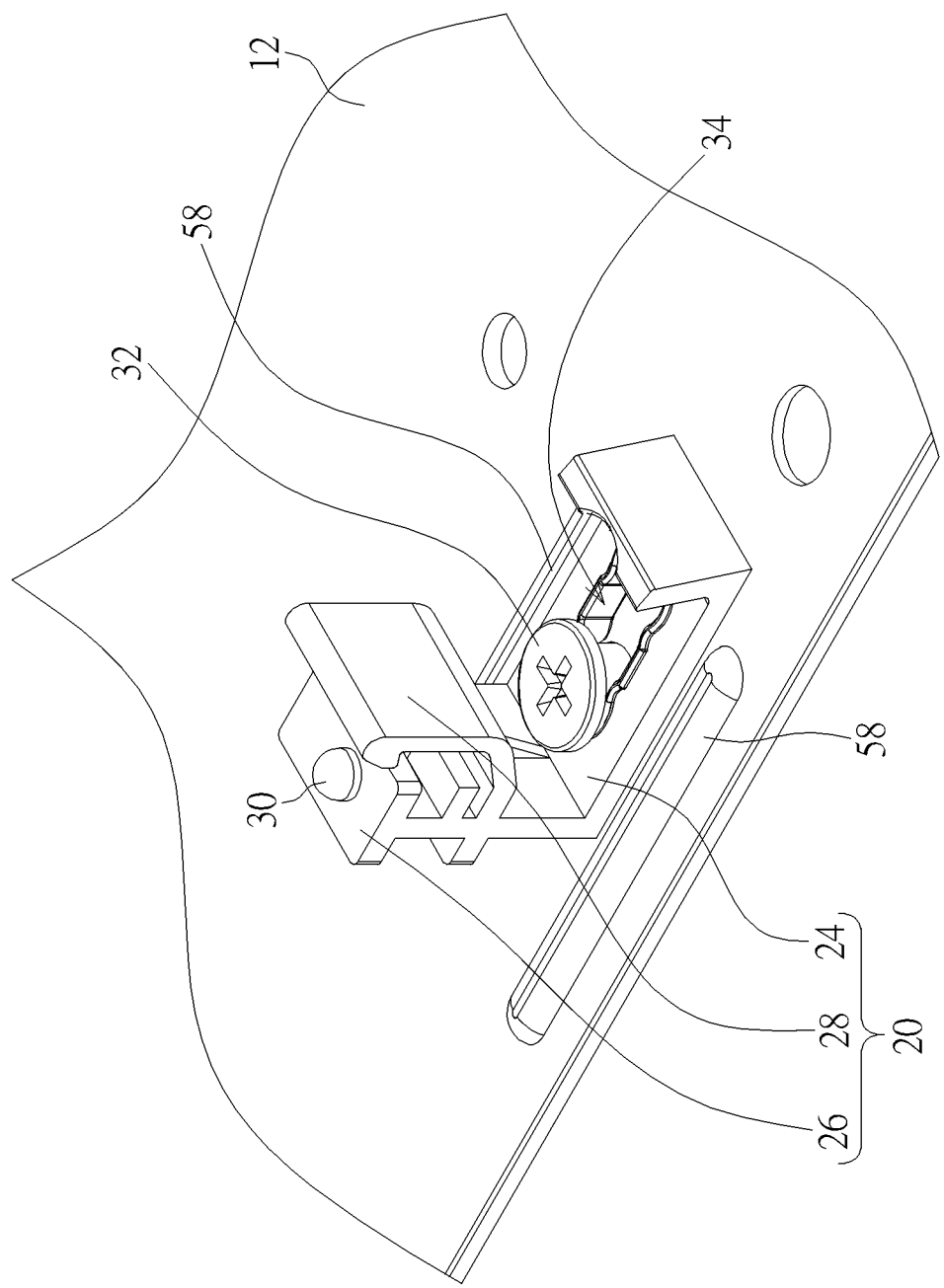
Figure 12:
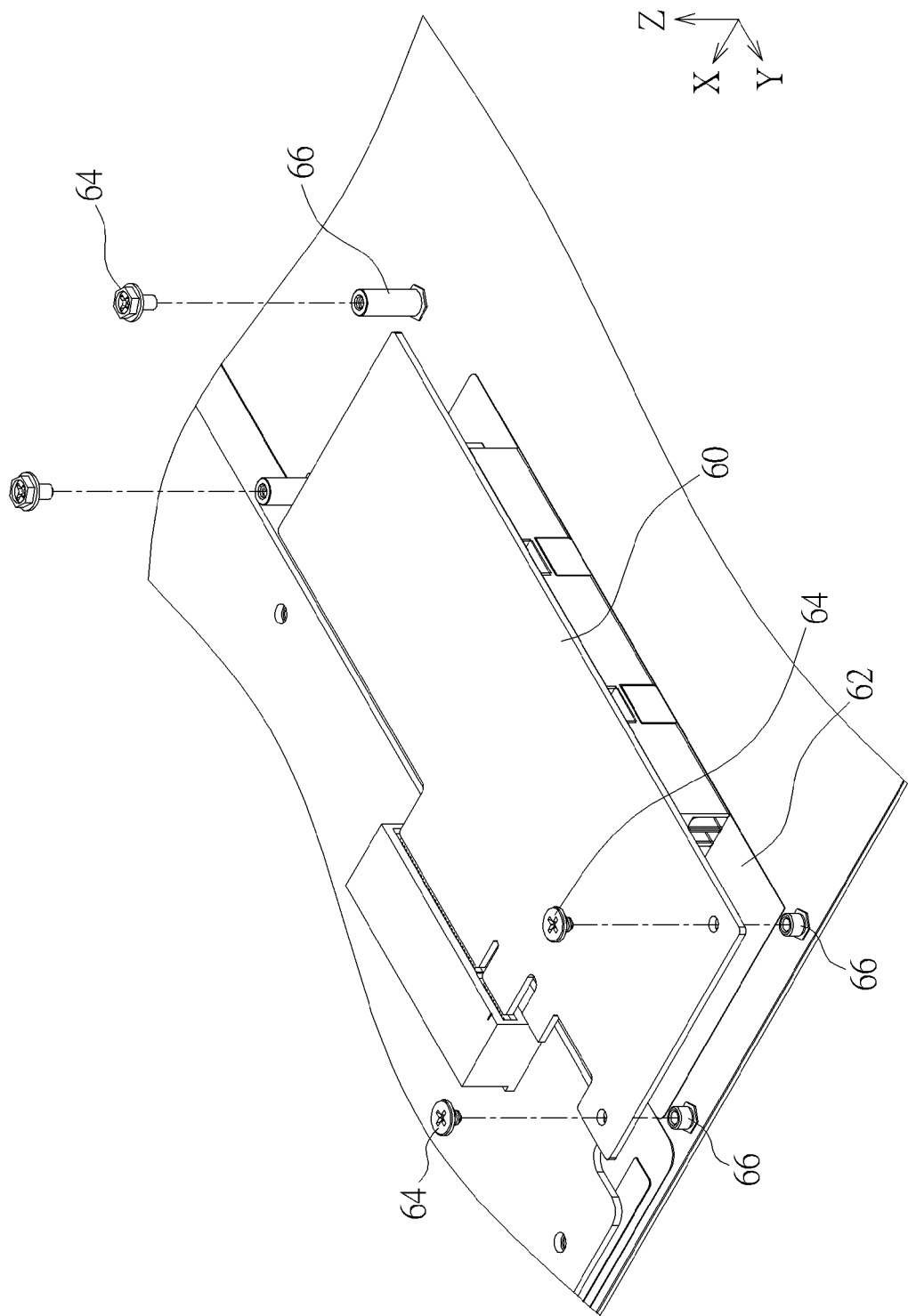
FIG. 12 is a diagram of a circuit board and a housing in prior art.

Please refer to FIG. 10 and FIG. 11. FIG. 10 and FIG. 11 respectively are diagrams of the base 12 according to different embodiments of the present disclosure, and the foresaid base 12 is suitable for the quick releasing mechanism and the electronic device of the first embodiment and the second embodiment. As shown in FIG. 10, the base 12 includes one or more protruding platforms 56 whereon the first constraining component 20 and/or the second constraining component 22 can be disposed optionally. The slide chute 38 may be formed on the protruding platform 56, the protruding platform 56 may be utilized to accommodate the positioning component 32, and a part of the positioning component 32 is accommodated under the protruding platform 56. As shown in FIG. 11, the base 12 includes two guiding bar structures 58 arranged in parallel. The first constraining component 20 and/or the second constraining component 22 can be slidably disposed between the two guiding bar structures 58 to prevent the first constraining component 20 and/or the second constraining component 22 from shaking while moving relative to the base 12, so as to increase assembly accuracy of the quick releasing mechanism. The above-mentioned embodiment illustrates the first constraining component 20 is located upon the protruding platform 56 and between the guiding bar structures 58, the second constraining component 22 further can be disposed upon the protruding platform 56 and/or between the guiding bar structures 58 via the main body 42 similarly, and a detailed description is omitted herein for simplicity.

The quick releasing mechanism in the first embodiment of the present disclosure utilizes the movable first constraining component to contact against the side of the interface card opposite to the connector, and further utilizes the movable second constraining component to contact against another side of the interface card different from the connector and the first constraining component, so that three sides of the interface card are respectively constrained by the connector, the first constraining component and the second constraining component to stably assemble the interface card with the base. The quick releasing mechanism in the second embodiment of the present disclosure utilizes the movable first constraining component to contact against the side of the interface card opposite to the connector, utilizes the immovable second constraining component to contact against another side of the interface card different from the connector and the first constraining component, and further utilizes the rotatable third constraining component to contact against the side of the interface card identical with the first constraining component, so the three sides of the interface card are respectively constrained by the connector, the first constraining component, the second constraining component and the third constraining component to stably assemble the interface card with the base. Comparing to the prior art, the electronic device with quick releasing function for the interface card of the present disclosure has advantages of simple structure and easy assembly/disassembly without the extra tools.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device with quick releasing function for an interface card, the electronic device comprising:
   a base whereon the interface card is disposed;
   a connector disposed on the base to electrically connect with the interface card; and
   a quick releasing mechanism disposed on the base, the quick releasing mechanism comprising:
      a first constraining component movably disposed on the base and adapted to shift between a releasing position and a constraining position, the first constraining component contacting against a side of the interface card opposite to the connector while moving to the constraining position, the first constraining component comprising a sliding portion, a supporting portion and a buckling portion, the sliding portion being slidably disposed on the base, the supporting portion being disposed on the sliding portion to support a first surface of the interface card, the buckling portion being connected to the supporting portion to press a second surface of the interface card opposite to the first surface; and
      a second constraining component disposed on the base and located on another orientation relative to the first constraining component, the second constraining component being adapted to contact the interface card against the connector.

2. The electronic device of claim 1, wherein the buckling portion comprises a protrusion piercing through an opening formed on the interface card, so as to constrain a movement of the interface card by the supporting portion of the first constraining component.

3. The electronic device of claim 1, wherein the quick releasing mechanism further comprises a positioning component locked on a locking hole formed on the base, the sliding portion comprises a slot structure slidably disposed on the positioning component, the sliding portion is adapted to move between the releasing position and the constraining position by assembly of the slot structure and the positioning component.

4. The electronic device of claim 3, wherein the sliding portion further comprises at least one contacting unit disposed on an inner wall of the slot structure, the contacting unit contacts against the positioning component to constrain a relative movement between the slot structure and the positioning component.

5. The electronic device of claim 1, wherein the base further comprises at least one slide chute, the first constraining component further comprises at least one guiding portion disposed on a bottom of the sliding portion opposite to the supporting portion and slidably disposed inside the at least one slide chute.

6. The electronic device of claim 1, wherein the second constraining component comprises a main body and an engaging portion connected to each other, the main body is slidably disposed on the base to shift between an disassembling position and an assembling position, the engaging portion is engaged with the interface card while the main body moves to the assembling position.

7. The electronic device of claim 1, wherein the second constraining component comprises a main body and an engaging portion connected to each other, the main body is slidably disposed on the base, the other side of the interface card slidably contacts against the engaging portion.

8. The electronic device of claim 1, wherein the quick releasing mechanism further comprises a third constraining component rotatably disposed on the base, the third constraining component contacts against the side of the interface card while the interface card is electrically connected to the connector.

9. The electronic device of claim 8, wherein the third constraining component comprises a rotating portion and a restraining portion connected to each other, the rotating portion pivots to the base via a shaft to shift between a blocking position and an unblocking position, the restraining portion contacts against the interface card while the rotating portion is shifted to the blocking position.

10. The electronic device of claim 9, wherein the restraining portion comprises a baffle to support the interface card while the rotating portion is shifted to the unblocking position.

11. The electronic device of claim 1, wherein the base comprises at least one protruding platform whereon the first constraining component and/or the second constraining component is disposed.

12. The electronic device of claim 1, wherein the base comprises two guiding bar structures arranged in parallel, the first constraining component is slidably disposed between the two guiding bar structures.

* * * * *